United States Patent
Wang

[19]

[11] Patent Number: 5,954,836
[45] Date of Patent: Sep. 21, 1999

[54] METHOD AND APPARATUS FOR PIPELINED ENCODING

[75] Inventor: Xiao-an Wang, Allentown, Pa.

[73] Assignee: Lucent Technologies, Inc., Murray Hills, N.J.

[21] Appl. No.: 09/007,720

[22] Filed: Jan. 15, 1998

[51] Int. Cl.[6] ............................ G06F 11/10; H03M 13/12
[52] U.S. Cl. ........................................... 714/786; 714/819
[58] Field of Search .................................. 714/786, 819; 370/209, 479; 375/200

[56] References Cited

U.S. PATENT DOCUMENTS

| | | | |
|---|---|---|---|
| 5,535,239 | 7/1996 | Padovani et al. | 370/209 |
| 5,629,955 | 5/1997 | McDonough | 375/200 |
| 5,659,569 | 8/1997 | Padovani et al. | 370/479 |

OTHER PUBLICATIONS

Wicker, *Error Control Systems for Digital Communication and Storage*; p. 264; (Prentice Hall, 1995).

Proakis, *Digital Communications*; Ch. 5.3 (Mc–Graw Hill, 1989) 2d.ed.

*Primary Examiner*—Phung M. Chung

[57] ABSTRACT

A convolutional encoding apparatus and method for encoding input data with bits stored in a shift register. A predetermined set of coefficient values is provided to define a coefficient mask value. It is then determined whether the bit of the input data is one of a logical zero and a logical one. Only if the bit of the input data is a logical one, the coefficient mask value and the shift register value are combined to produce a next shift register value. Predetermined ones of the bits of the next shift register value are then selected as coded output data.

22 Claims, 4 Drawing Sheets

$g_0(D) = I + D^2 + D^4$ $g_1(D) = I + D + D^2 + D^3 + D^4$

METHOD AND APPARATUS FOR PIPELINED ENCODING

FIELD OF THE INVENTION

This invention relates to encoding and, particularly, to a method and apparatus for pipelined encoding of convolutional codes.

BACKGROUND OF THE INVENTION

Convolutional encoding offers an approach to error control wherein an entire data stream is converted, regardless of its length, into a single code word. Wicker, *Error Control Systems for Digital Communication and Storage*, p. 264 (Prentice Hall, 1995). Convolutional encoding has traditionally been implemented with linear shift registers using parity based algorithms. A block diagram of a conventional rate-1/2 convolutional encoder is illustrated in FIG. 4. The rate of this encoder is established by the fact that the encoder outputs two bits for every input bit. Wicker at p. 265. The conventional convolutional encoder includes shift register 700, first AND gate 705 and second AND gate 710. Shift register 700 has a series of memory elements. A stream of input data to be encoded is input to shift register 700 With each successive bit input to shift register 700, selected memory elements of shift register 700 are tapped off at interconnections 702 and added at first AND gate 705 according to a fixed pattern, represented by polynomial go shown in equation (1) below:

$$g0(D)=1+D^2+D^4 \quad (1)$$

Wicker at p. 265–66. At interconnections 707, a different group of selected memory elements of shift register 700 are tapped off and added at second AND gate 710 according to another fixed pattern, represented by polynomial g1(D) shown in equation (2) below.

$$g1(D)=1+D^1+D^2+D^3+D^4 \quad (2)$$

Coded output data R0 and R1 represent the parity bits of g0 and g1, respectively.

Alternatively, the conventional convolutional encoder shown in FIG. 4 may be implemented in software. In a software implementation, the values $g_0$ and $g_1$ may be stored in a memory. Table 1 below shows pseudo code for implementing the conventional convolutional encoder in software.

TABLE 1

| BEGIN | shift_reg = (shift_reg< <1) + new_data_bit; |
|---|---|
| | temp = shift_reg & g0 |
| | if the parity of temp is even, r0 = 0; |
| | else r0 = 1; |
| | temp = shift_reg & gi; |
| | if the parity of temp is even, r1 = 0; |
| | else r1 = 1; |
| | output r0, r1; |
| | new_data_bit = next_bit; |
| | go to BEGIN |

When this pseudo code is implemented in a DSP1600 available from Lucent Technologies, the parity based algorithm may take 5+3n cycles for a rate-1/n convolutional encoder where n is an integer. For example, a rate-1/2 convolutional encoder (n=2) uses 11 cycles to encode a bit. A rate-1/3 convolutional encoder (n=3) uses 14 cycles to encode a bit.

Alternatively, the bits may be encoded in a parallel encoding process. For example, a 16 bit word may be encoded in parallel. In this case, using a rate-1/2 convolutional encoder according to the IS-54 standard of the Telecommunications Industry Association, the DSP1600 encodes 96 bits in 938 cycles. In other words, a bit is encoded every 9.7 cycles on average. For rate-1/n encoders where n>2, the parallel approach is not as efficient as the parity based algorithm described above. Moreover, the parallel algorithm assumes the inputs to be in a 16-bit word format which in many applications including applications using the IS-136 of the Telecommunications Industry Association, extra cycles are used to convert from the bit format. The extra cycles also make the parallel encoding process less efficient.

SUMMARY OF THE INVENTION

The present invention provides a convolutional encoding apparatus and method for encoding input data with bits stored in a shift register. The input data includes at least one bit. A predetermined set of coefficient values is provided to define a coefficient mask value. It is then determined whether the bit of the input data is one of a logical zero and a logical one. Only if the bit of the input data is a logical one, the coefficient mask value and the shift register value are combined to produce a next shift register value. Predetermined ones of the bits of the next shift register value are then selected as coded output data.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

Convolutional encoding has been discussed by Stephen Wicker, *Error Control Systems for Digital Communication and Storage*, Ch. 11, p. 264–73 (Prentice Hall, 1995), and John Proakis in *Digital Communications*, Ch. 5.3, p. 440–47 (McGraw Hill, 1989), all of which are herein incorporated by reference.

Figure 1:
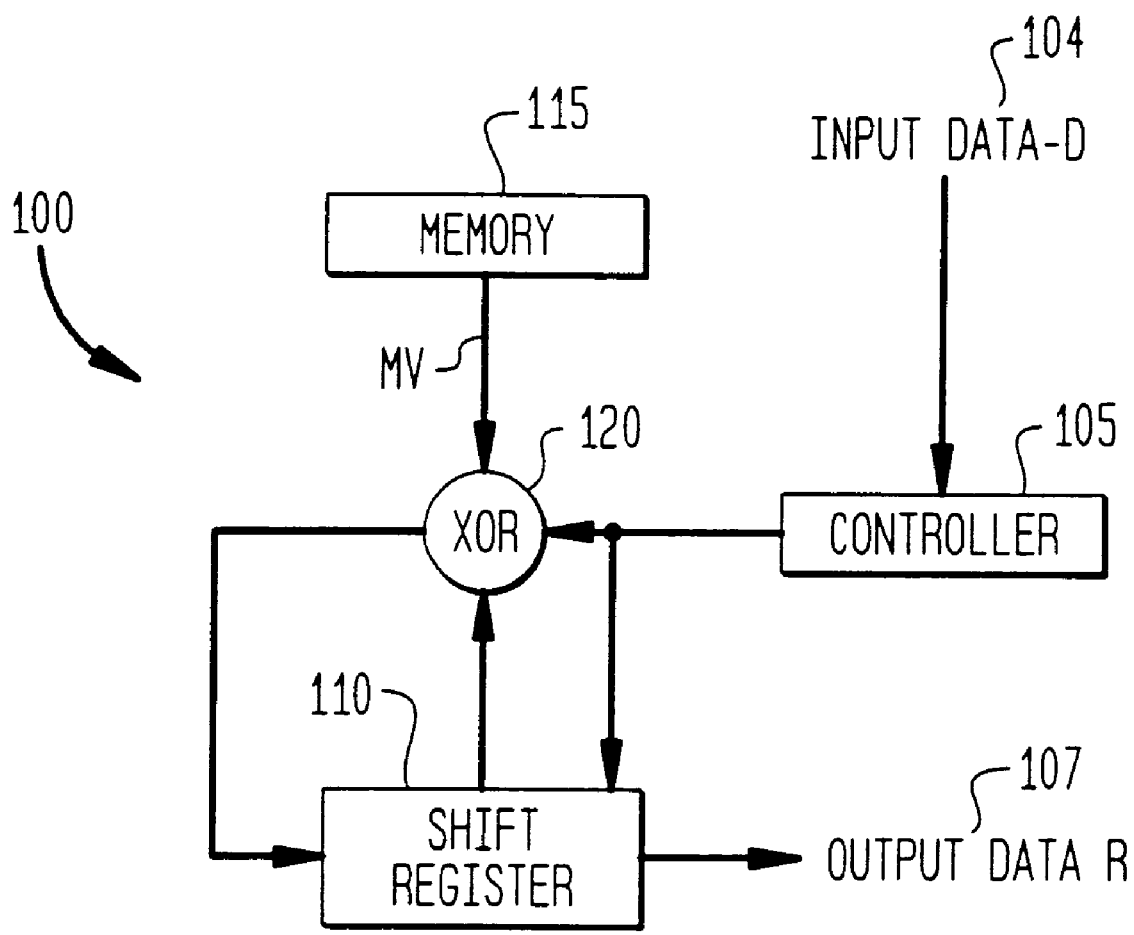
FIG. 1 is a block diagram of an encoding apparatus according to an exemplary embodiment of the present invention.
Figure 2:
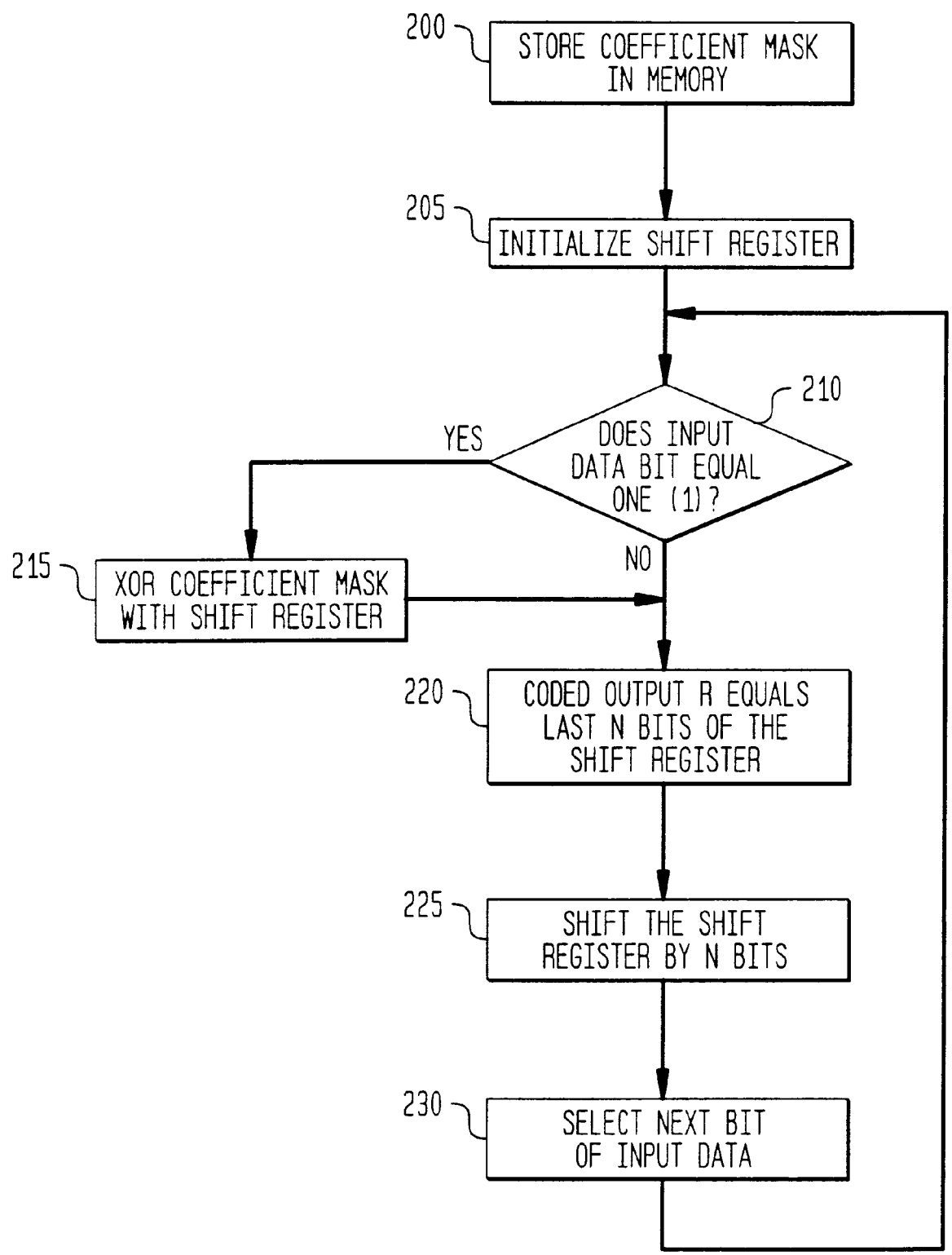
FIG. 2 is a flow chart diagram describing the operation of the encoding apparatus shown in FIG. 1.

FIG. 1 shows an encoding apparatus 100 according to an exemplary embodiment of the present invention. The operation of the encoding apparatus 100 is described below with reference to FIG. 2.

Coefficient values gi used for encoding input data D are derived according to a fixed pattern using equation (3) below.

$$gi = g_{i,m}D^m + \ldots + g_{i,1}D + g_{i,0} \qquad (3)$$

where i=0, 1, . . . , n
and m=0, 1, . . . , p

Coefficient values gi are rearranged to form the coefficient mask value MV to produce the coded output data R 107. The width of coefficient mask value MV depends on both the rate of the convolutional encoder (n) and the degrees of coefficient values gi (m), according to the equation:

$$(m+1)*n \qquad (4)$$

A coefficient mask value MV according to one embodiment of the present invention is set forth below.

MV=g0, mg1, mg2, m . . . gi,m . . . g0,1g1,1g2,1 . . . gi, 1g0,0g1, 0, g2,0 . . . gi,0

In one example, the mask value MV includes twenty seven bits for a rate-1/3 convolutional encoder. In other words, the value n equals three and the value m equals eight.

At step 200, the coefficient mask value MV is stored in memory 115. Encoding apparatus 100 utilizes the coefficient mask value MV to produce coded output data R 107. At step 205, controller 105 initializes shift register 110 to zero just prior to reading in the first bit of input data (D) 104. At step 210, controller 105 determines whether the bit is a logical one or a logical zero. If the bit is a logical one, at step 215, controller 105 generates a control signal causing XOR gate 120 to XOR the coefficient mask value MV provided from memory 115 and the current shift register value provided from shift register 110. The new shift register value XRV produced by XOR gate 120 is stored back in shift register 110. At step 220, controller 105 causes n bits of shift register 110 to be selected and shifted out of shift register 110 as coded output data R 107. At step 225, the remaining values XRV in shift register 110 are shifted by n bits. In one example of a rate-1/3 convolutional encoder, shift register 110 is five bits wide. Three right-most bits are shifted out of shift register 110 to the right, at step 220, following by the remaining 2 bits in shift register 110 being shifted right by 3 bits, at step 225. At step 230, controller 105 selects the next bit of input data 104, and the apparatus and method according to the present invention return to step 210.

At step 210, if controller 105 determines that the data bit from input data 104 is a logical zero, the control proceeds to step 220. At step 220, controller 105 causes n bits of shift register 110 to be selected and shifted out of shift register 110 as coded output data R 107. At step 225, the remaining values XRV in shift register 110 are shifted by n bits. At step 230, controller 105 selects the next bit of input data 104, and the apparatus and method according to the present invention returns to step 210. This process is repeated until each bit in the data word provided in the input data is coded.

Figure 4:
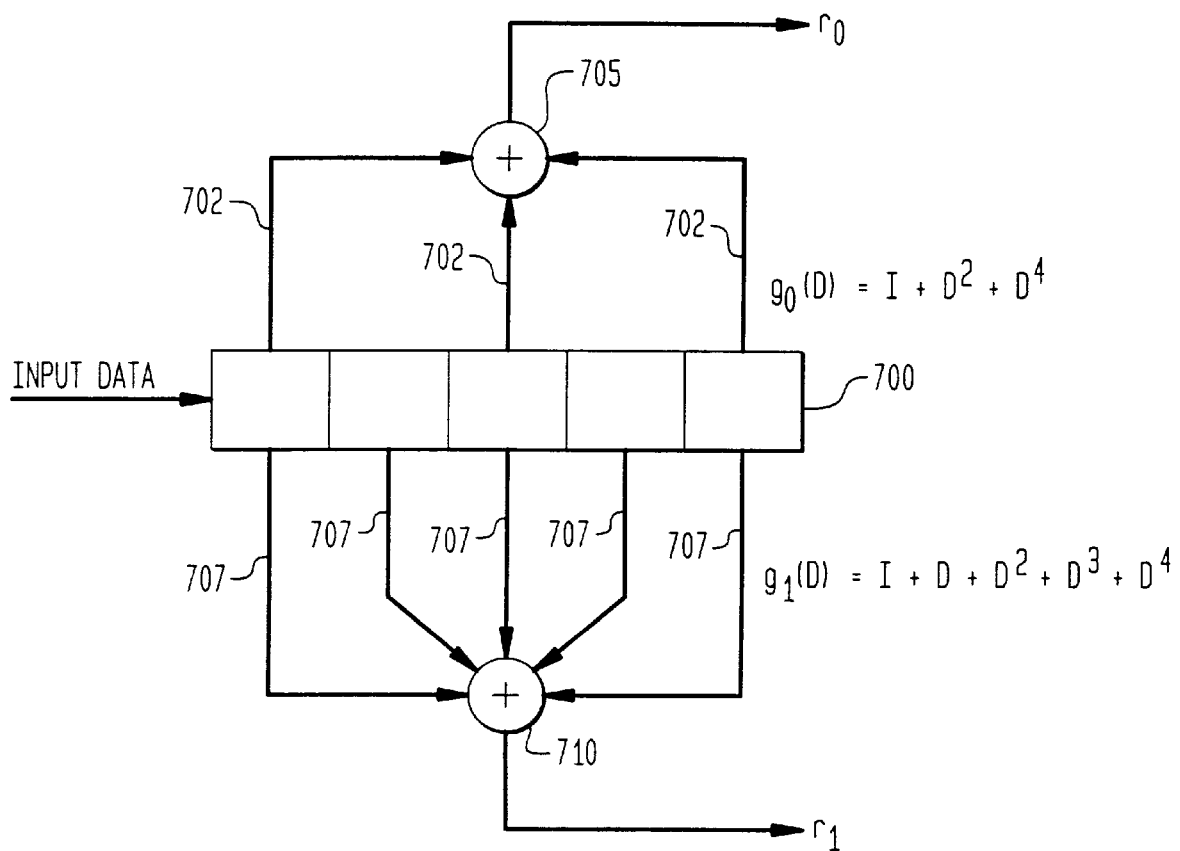
FIG. 4 is a block diagram of an encoding apparatus according to the prior art.

The speed of the convolutional encoding process is increased by using encoding apparatus 100. For example, the encoding apparatus 100 encodes each bit in six cycles for a rate-1/n convolutional encoding regardless of the value of n. In contrast, the prior art system shown in FIG. 4 uses (5+3*n) cycles to code each bit. Further, encoding apparatus 100 encodes bits in the 16-bit word format according to the IS-54 standard in less than 740 cycles for 96 bits. In contrast, the prior art parallel encoder uses 938 cycles to encode 96 bits for the 16-bit word format according to the IS-54 standard. In addition, fewer components are necessary to implement the encoding apparatus than the prior art system shown in FIG. 4. As a result, less area on a chip is required to implement encoding apparatus 100. Encoding apparatus 100 also has a lesser amount of latency and, thus, the encoding apparatus is faster than the prior art system shown in FIG. 4.

According to another exemplary embodiment of the present invention, encoding apparatus 100 may be implemented in software. Similar to the embodiment described with reference to FIG. 1, coefficient values gi used for encoding input data D are derived according to a fixed pattern using equation (3) above.

As described above, coefficient values gi are then rearranged to form the coefficient mask value to produce the coded output data R. The coefficient mask value is stored as variable MASK. The software then proceeds through the pseudo code illustrated in Table 2 for each bit of input data to obtain coded output data R.

TABLE 2

| LOOP | SHIFT_REG = 0;<br>if input data bit is 1; then:<br>SHIFT_REG = SHIFT_REG ^ MASK;<br>R = n bits of SHIFT_REG;<br>SHIFT_REG = SHIFT_REG > > n;<br>selevt next bit of input data;<br>goto LOOP |
|---|---|

Figure 5:
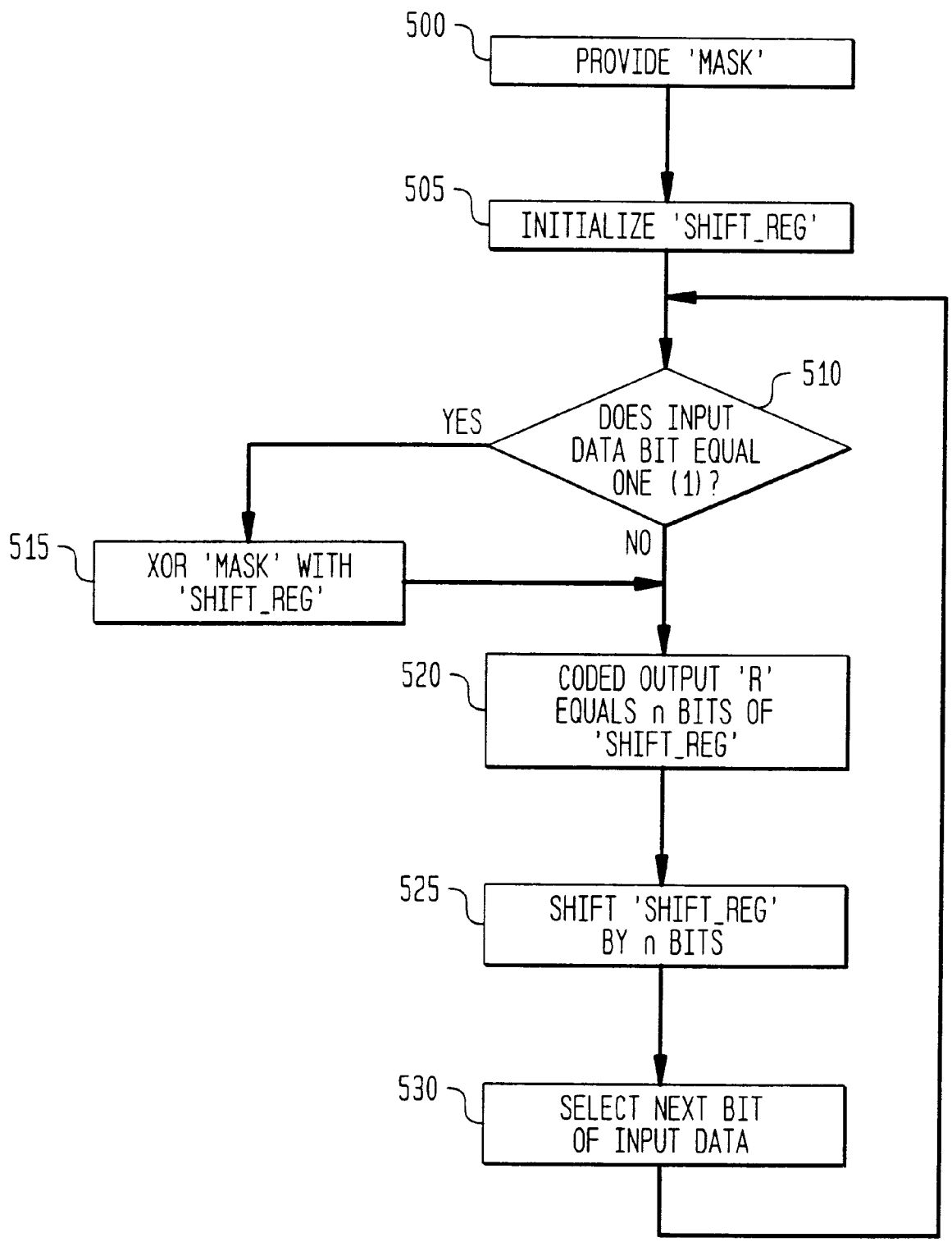
FIG. 5 is a flow chart diagram describing the operation of the encoding apparatus according to an exemplary software embodiment of the present invention.

The operation of a software embodiment using the pseudo code illustrated in Table 2 is described below with reference to FIG. 5. Variable SHIFT_REG simulates shift register 110 in software. At step 505, as with shift register 110 in FIG. 1, SHIFT_REG is initialized to zero just prior to reading the first bit of input data. The software then reads the first bit of input data at step 510 and determines whether the bit is a logical one or a logical zero. At step 515, if the bit is a logical one, an XOR operation is performed between variable MASK and variable SHIFT_REG, the result of which is stored back as variable SHIFT_REG. Proceeding to step 520, n bits of the value stored in variable SHIFT_REG are selected as coded output data R. At step 525, the remaining values in SHIFT_REG are then shifted by n bits. In one example of a rate-1/3 convolutional encoder simulated in software, variable SHIFT_REG is five bits wide. Three right-most bits are shifted out of SHIFT_REG to the right, at step 520, following by the remaining 2 bits in SHIFT_REG being shifted right by 3 bits, at step 525. At step 530, the next bit of input data is then read, and the software returns to step 510. The process repeats for each bit of input data.

If, at step 510, for any given bit, the software determines that the data bit is a logical zero, the software proceeds to step 520, at which n bits of the value stored in variable SHIFT_REG are selected as coded output data r. At step 525, the remaining values in SHIFT_REG are shifted by n bits. At step 530, the next bit of input data is then read, and the software returns to step 510.

The pseudo code illustrated in Table 2 is then repeated for each bit of input data.

In one example of a software embodiment of the convolutional encoding apparatus and method according to the present invention, the apparatus and method may be implemented with C code. Similar to the software embodiment using pseudo code, coefficient values gi used for encoding input data D are derived according to a fixed pattern using equation (3) above.

As described above, coefficient values gi are then rearranged to form the coefficient mask value to produce coded output data R. The coefficient mask value is then stored as variable MASK. The software then proceeds through the C code illustrated in Table 3.

TABLE 3

```
1      srand48(RANDOM_SEED);
2      WORK_BENCH = 0;
3      for (k = 0; k < TEST_LENGTH; k++);
4          if (drand48( ) < 0.5) INFO_BIT = 0;
           else INFO_BIT = 1;
5          if (INFO_BIT = = 1) WORK_BENCH^ = MASK;
6          out_bits = WORK_BENCH & 7;
7          printf(" % 1d", OUT_BITS);
8          WORK_BENCH > > = 3;
9      for (k = 0; k < 8; k++)
10         OUT_BITS = WORK_BENCH & 7;
11         WORK_BENCH > > = 3;
12         printf(" %1d", OUT_BITS);
```

Using the C code illustrated in Table 3, simulated input data, is generated within the program. At line 1, a seed is placed in random number generator RANDOM_SEED so simulated input data can be generated. At line 2, as with shift register 110 in FIG. 1, WORK_BENCH is initialized to zero just prior to generating the first bit of simulated input data. Variable WORK_BENCH simulates shift register 110 of FIG. 1 in C code.

Line 3 represents the beginning of a for-loop within which the apparatus and method according to the present invention operates on k individual bits of simulated input data. In particular, at line 4, an individual bit of simulated input data INFO_BIT is generated using random number generator RANDOM_SEED. Depending on the probability density function of RANDOM_SEED, a given value of INFO_BIT will be either a logical one or a logical zero. Once a value for INFO_BIT is generated, at line 5, the C code then determines whether INFO_BIT is a logical one or a logical zero. If the bit is a logical one, an XOR operation is performed between variable MASK and variable WORK_BENCH, the result of which is stored back as variable WORK_BENCH. In this example of a rate 1/3 convolutional encoder, 3 bits of the value stored in variable SHIFT_REG are selected as coded output data R. This is accomplished at line 6 by performing an AND operation between WORK_BENCH and the number 7 (binary 111) and then returning the result as variable OUT_BITS at line 7. At line 8, the remaining values in WORK_BENCH are then shifted by 3 bits. The software then returns to line 3 and the next INFO_BIT is generated. The process repeats for k bits of input data.

If, at line 4, for any given bit of simulated input data, the software determines that INFO_BIT is a logical zero, the software proceeds from line 4 to line 6, at which 3 bits of the value stored in variable SHIFT_REG are selected as coded output data r. This is accomplished at line 6 by performing an AND operation between WORK_BENCH and the number 7 (binary 111) and then returning the result as variable OUT_BITS at line 7. At line 8, the remaining values in WORK_BENCH are then shifted by 3 bits. The software then returns to line 3 and the next INFO_BIT is generated.

The C code illustrated in Table 3 is then repeated for k bits of input data.

Figure 3:
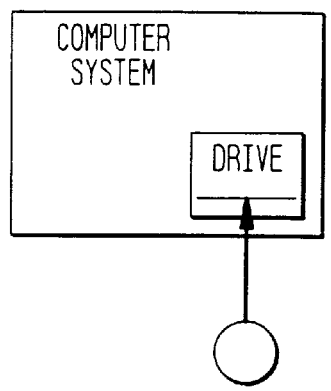
FIG. 3 is a block diagram of an encoding apparatus according to another exemplary embodiment of the present invention.

As shown in FIG. 3, the pseudo code shown in Table 2 may be stored on a disk 300 and placed in a computer system for execution. Although a disk 300 is shown for storage of the pseudo code in Table 2, the pseudo code may be stored in a computer chip memory, tape, or any one of a variety of storage mediums which are readable by a computer system or processor for execution.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A method of convolutional encoding of input data with bits stored in a shift register to define a shift register value, the input data including at least one bit, comprising the steps of:

a) providing a predetermined set of coefficient values to define a coefficient mask value;

b) determining whether the bit of the input data is one of a logical zero and a logical one;

c) performing an exclusive OR operation, only if the bit of the input data is a logical one, between the coefficient mask value and the shift register value to produce a next shift register value; and d) selecting predetermined ones of the bits of the next shift register value as coded output data.

2. The method of convolutional encoding according to claim 1 in which step a) includes deriving the set of coefficient values according to a fixed pattern using the bits of the input data.

3. The method of convolutional encoding according to claim 1 in which step a) includes deriving the set of coefficient values (gi) using the bits of the input data (D) according to the equation:

$$gi = gi, m^{D^m} + \ldots + gi,1^D + gi,0$$

i=0, 1, . . . , n
m=0, 1, . . . , p
   wherein n and p are integers.

4. The method of convolutional encoding according to claim 3 wherein n is a n integer representing the inverse of the rate of operation of the convolutional encoding method.

5. The method of convolutional encoding according to claim 3 in which step a) includes defining the coefficient mask value (MV) by arranging the set of coefficient values according to the pattern:

g0, mg1, mg2,m . . . gi,m . . . g0,1g1,1g2,1 . . . gi,1g0,0g1,0, g2,0 . . . gi,0.

6. The method of convolutional encoding according to claim 1 comprising the further step of initializing the shift register value to a logical zero.

7. The method of convolutional encoding according to claim 1 in which steps a), b), c) and d) include operating at a rate of 1/n where n is an integer, and in which step (d) includes selecting n bits of the next shift register value.

8. The method of convolutional encoding according to claim 1 further comprising the steps of:

e) reading in a second bit of the input data;

f) determining whether the second bit of the input data is one of a logical zero and a logical one;

g) combining, only if the second bit is a logical one, the coefficient mask value and the shift register value to produce the next shift register value; and h) selecting predetermined ones of the bits of the next shift register value as coded output data.

9. The method of convolutional encoding according to claim 1 in which step (d) includes leaving remaining bits in the next shift register value, the method further comprising the step of shifting the remaining bits within the next shift register value.

10. The method of convolutional encoding according to claim 1 further comprising the steps of:

storing the coefficient mask value in a memory; and retrieving the coefficient mask value from the memory to be combined with the shift register value.

11. A convolutional encoding apparatus for encoding input data with bits stored in a shift register to define a shift register value, the input data including at least one bit, comprising:

a memory for providing a predetermined set of coefficient values to define a coefficient mask value;

a controller for receiving the bit of input data and for determining whether the bit of the input data is one of a logical zero and a logical one; and an exclusive OR circuit coupled to the controller and the memory for performing an exclusive OR operation, only if the bit of the input data is a logical one, between the coefficient mask value and the shift register value to produce a next shift register value; wherein the shift register shifts predetermined ones of the bits of the next shift register value as coded output data.

12. The convolutional encoding apparatus according to claim 11 wherein the controller derives the set of coefficient values according to a fixed pattern using the bits of the input data and stores the set of coefficient values in the memory.

13. The convolutional encoding apparatus according to claim 11 wherein the controller derives the set of coefficient values using the bits of the input data (D) according to the equation:

$$gi=gi, m^{D^m}+ \ldots +gi,1^D+gi,0$$

i=0, 1, . . . , n
m=0, 1, . . . , p
wherein n and p are integers.

14. The convolutional encoding apparatus according to claim 13 wherein n is an integer representing the inverse of the rate of operation of the convolutional encoding apparatus where i is an integer ranging from 0 to n.

15. The convolutional encoding apparatus according to claim 13 wherein the controller defines the coefficient mask value (MV) by arranging the set of coefficient values according to the pattern:

g0, mg1, mg2,m . . . gi,m . . . g0,1g1,1g2,1 . . . gi,1g0,0g1,0, g2,0 . . . gi,0.

16. The convolutional encoding apparatus according to claim 11 wherein the controller initializes the shift register value to a logical zero.

17. The convolutional encoding apparatus according to claim 11 in which the encoding apparatus operates at a rate of 1/n where n is an integer, and the shift register shifts n bits of the next shift register value.

18. The convolutional encoding apparatus according to claim 11 in which the shift register leaves remaining bits in the next shift register value and shifts the remaining bits within the next shift register value.

19. A convolutional encoding apparatus for encoding input data with bits stored in a shift register, the input data including at least one bit, comprising:

mask means for providing a predetermined set of coefficient values to define a coefficient mask value;

means for determining whether the bit of the input data is one of a logical zero and a logical one;

means for performing an exclusive OR operation, only if the bit of the input data is a logical one, between the coefficient mask value and the shift register value to produce a next shift register value; and means for selecting predetermined ones of the bits of the next shift register value as coded output data.

20. The convolutional encoding apparatus according to claim 19 wherein the mask means includes means for deriving the set of coefficient values according to a fixed pattern using the bits of the input data.

21. The convolutional encoding apparatus according to claim 19 wherein the mask means includes means for deriving the set of coefficient values using the bits of the input data (D) according to the equation:

$$gi=gi, m^{D^m}+ \ldots +gi,1^D+gi,0$$

i=0, 1, . . . , n
m=0, 1, . . . , p
wherein n and p are integers.

22. The convolutional encoding apparatus according to claim 21 wherein n is an integer representing the inverse of the rate of operation of the convolutional encoding apparatus where i is an integer ranging from 0 to n.

* * * * *